(12) United States Patent
Morinaga (10) Patent No.: US 7,258,465 B2
(45) Date of Patent: Aug. 21, 2007

(54) PROJECTOR

(75) Inventor: Kenichi Morinaga, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 90 days.

(21) Appl. No.: 10/998,427

(22) Filed: Nov. 29, 2004

(65) Prior Publication Data

US 2005/0117346 A1 Jun. 2, 2005

(30) Foreign Application Priority Data

Nov. 27, 2003 (JP) ............................ 2003-397422

(51) Int. Cl.
*F21V 29/00* (2006.01)
*B60Q 1/06* (2006.01)
*B60Q 1/00* (2006.01)

(52) U.S. Cl. ...................... 362/294; 362/373; 362/264; 362/547

(58) Field of Classification Search ................ 362/294, 362/373, 264
See application file for complete search history.

(56) References Cited

U.S. PATENT DOCUMENTS 5,420,769 A * 5/1995 Ahlgren et al. ............. 362/294
6,827,470 B2 * 12/2004 Sagal et al. ................. 362/341
2005/0122724 A1 * 6/2005 Hirata et al. ................ 362/345

FOREIGN PATENT DOCUMENTS

| JP | 07159484 A | * | 6/1995 |
| JP | 1995-335015 | | 12/1995 |
| JP | 9-304834 | | 11/1997 |
| JP | 2002-313119 | | 10/2002 |

OTHER PUBLICATIONS

Patent Abstracts of Japan, Publication No. 9-304834, Publication Date Nov. 28, 1997, 1 page.
Office Action dated Apr. 26, 2006 issued by the Japanese Patent Office in Japanese Patent Application No. 2002-397422, with English translation, 3 pages.

* cited by examiner

*Primary Examiner*—Renee Luebke
*Assistant Examiner*—Evan Dzierzynski
(74) *Attorney, Agent, or Firm*—Osha Liang LLP (57) ABSTRACT

A projector including a light source lamp including a light source, a reflector, and a flange portion, a lamp case, and a cooling fan includes a heat radiating member for cooling the light source lamp, the heat radiating member includes a flange attaching portion, a fixing portion and a heat radiating fin portion, the heat radiating fin portion is formed by a shape memory alloy brought into close contact with an outer peripheral face of the light source lamp when temperature at a vicinity of the outer peripheral face becomes higher than predetermined temperature and separated from the outer peripheral face when the temperature at the vicinity of the outer peripheral face becomes lower than the predetermined temperature, and the heat radiating fin portion includes a fin portion and an opening portion.

9 Claims, 7 Drawing Sheets

PROJECTOR

BACKGROUND OF THE INVENTION

1. Field of the Invention

The present invention relates to a projector, particularly relates to a projector having a cooling fan for maintaining temperature of a light source lamp at predetermined temperature.

2. Description of the Related Art

In a background art, there is known a projector having a cooling fan for maintaining temperature of a light source lamp at predetermined temperature (refer to, for example, JP-A-9-304834).

In JP-A-9-304834, mentioned above, there is disclosed a projector according to an example of the background art arranged with a lamp box provided with an exhausting fan (cooling fan) on a rear side of a light source lamp at inside of a cabinet and having an opening portion including a bimetal or a shape memory alloy for making an opening state variable by driving a fin in accordance with temperature at inside of the cabinet on a rear side of the lamp box. According to a structure disclosed in JP-A-9-304834, during a time period in which temperature at inside of the cabinet is low, leakage of light from a vent hole provided on a rear face of the cabinet is prevented with priority by narrowing an opening of the opening portion. Further, when temperature at inside of the cabinet rises, temperature rise at inside of the cabinet is restrained by facilitating to exhaust air from the lamp box by the exhausting fan by widening the opening of the opening portion in accordance with temperature rise.

Figure 10:
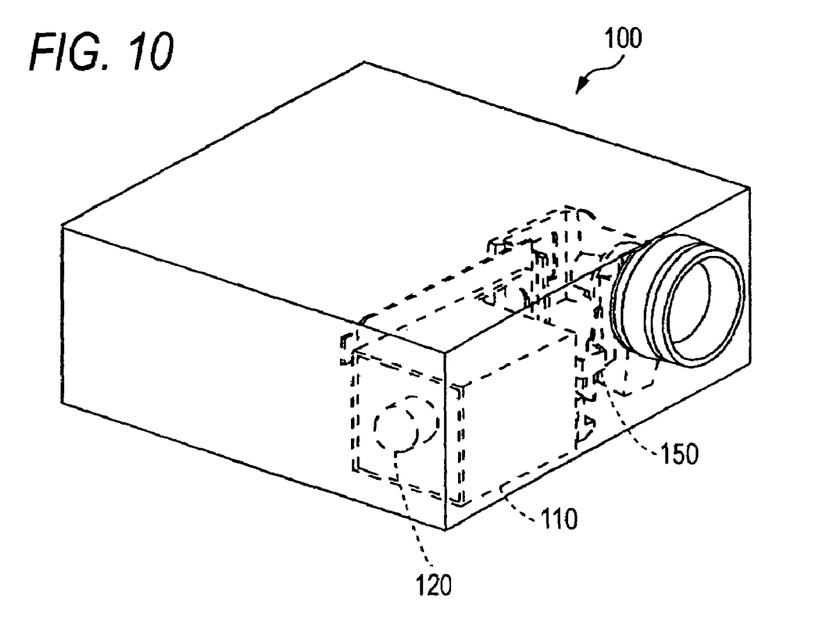
FIG. 10 is a perspective view of a projector having a cooling fan for maintaining a light source lamp at predetermined temperature according to an example of a background art.
Figure 11:
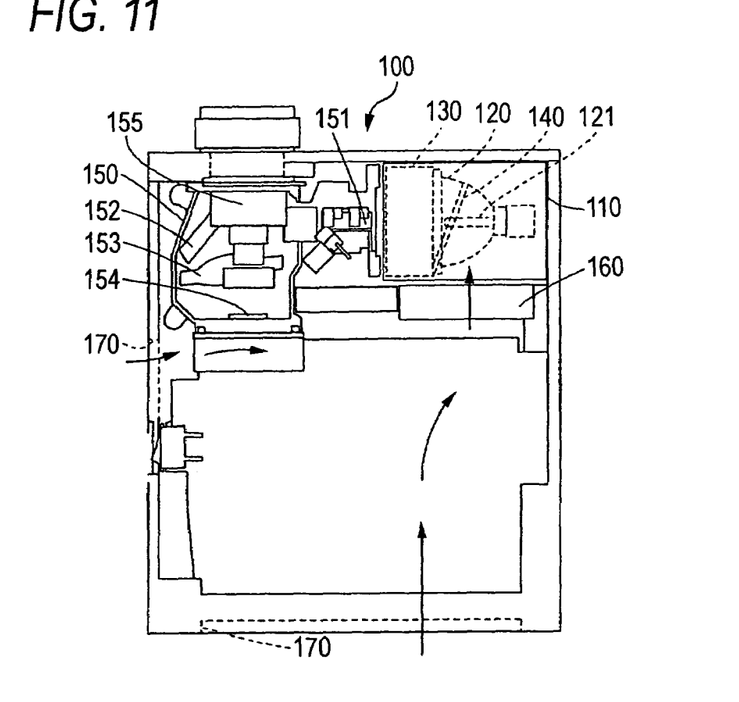
FIG. 11 is a top view of the projector according to the example of the background art shown in FIG. 10.
Figure 12:
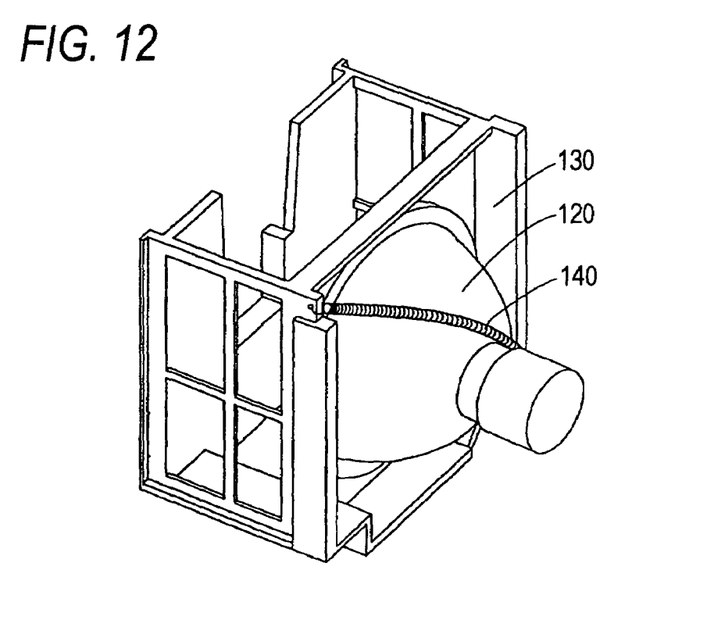
FIG. 12 is a perspective view showing a light source lamp and a lamp case of the projector according to the example of the background art shown in FIG. 11.
Figure 13:
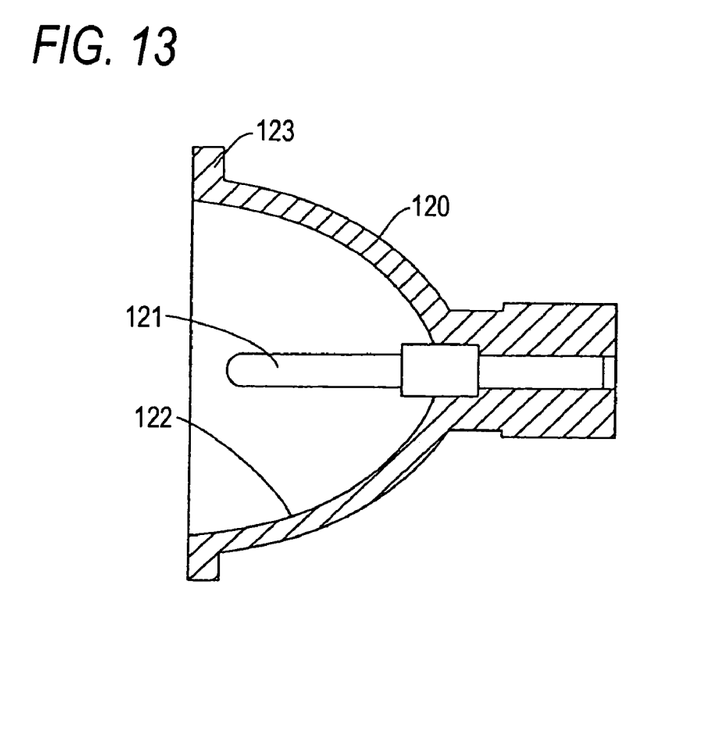
FIG. 13 is a sectional view of the light source lamp of the projector according to the example of the background art shown in FIG. 12.

FIG. 10 is a perspective view of a project or having a cooling fan for maintaining a light source lamp at predetermined temperature according to other example of the background art. FIG. 11 is a top view of the projector according to the other example of the background art shown in FIG. 10. FIG. 12 is a perspective view showing a light source lamp and a lamp case of the projector according to the other example of the background art. FIG. 13 is a sectional view of the light source lamp of the projector according to the other example of the background art shown in FIG. 12. An explanation will be given of a structure of a projector 100 according to the other example of the background art in reference to FIG. 10 through FIG. 13.

As shown by FIG. 10 and FIG. 11, the projector 100 according to the other example of the background art is provided with a lamp case holder 110, a light source lamp 120 including an ultra high pressure mercury lamp contained at inside of the lamp case of the holder 110, a lamp case 130 attached with the light source lamp 120, a coil spring 140 for fixing the light source lamp 120 to the lamp case 130, a projecting portion 150 for forming an image for projecting to a screen (not illustrated) by using light of the light source lamp 120, a cooling fan 160 arranged on a side of a side face of the light source lamp 120 for maintaining the light source lamp 120 at predetermined temperature, and a suction port 170 for supplying outside air to the cooling fan 160 at inside of the apparatus.

As shown by FIG. 12, the light source lamp 120 is fixed to the lamp case 130 by the coil spring 140. As shown by FIG. 13, the light source lamp 120 including the ultra high pressure mercury lamp includes a light source 121, a reflector 122 in a recessed shape for reflecting light from the light source 121 in a front direction, and a flange portion 123 provided at an end portion of the reflector 122. The light source 121 is provided at a center portion of the reflector 122.

Further, as shown by FIG. 11, the projecting portion 150 includes a light tunnel 151, a mirror 152, a lens 153, a DMD element 154, and a projecting lens 155. The light tunnel 151 is provided with a function of shaping light emitted from the light source lamp 120 in a rectangular shape. Further, the mirror 152 is provided for reflecting light in the rectangular shape shaped by the light tunnel 151 in a direction of arranging the DMD element 154. Light reflected by the mirror 152 is made to be incident on the DMD element 154 via the lens 153. Further, the DMD element 154 is an element for forming an image by controlling light incident on the DMD element 154. Further, the image formed by the DMD element 154 is projected to a screen (not illustrated) by passing the projecting lens 155.

Here, in the projector 100 according to the other example of the background art shown in FIG. 11, there is a drawback that whereas temperature of the light source lamp 120 including the ultra high pressure mercury lamp excessively rises, the light source 121 is destructed, when temperature of the light source lamp 120 falls excessively, a brightness is reduced. Therefore, in the projector 100 according to the other example of the background art, in operating the projector 100, the light source lamp 120 is maintained always at predetermined temperature (about 400 .C through about 500 .C) by the cooling fan 160 and a temperature sensor (not illustrated).

However, in the projector according to the other example of the background art, when the projector 100 stops to operate, also the cooling fan 160 stops to operate. Therefore, there is brought about a drawback that immediately after stopping to operate the projector 100, temperature at an other peripheral face of the light source lamp 120 rapidly rises by residual heat of the light source 121 of the light source lamp 120. The rapid temperature rise of the outer peripheral face of the light source lamp 120 constitutes a factor of bringing about a thermal deterioration, deformation or the like of a part at a surrounding of the light source lamp 120. Therefore, according to the projector 100 of the background art, there is a drawback that it is necessary to form the part or the cabinet made of resin arranged at the surrounding of the light source lamp 120 by an expensive heat resistant material. Thereby, there poses a problem that product cost is increased.

Further, according to the structure disclosed in JP-A-9-304834, mentioned above, the opening portion including a bimetal or a shape memory alloy an opening degree of which is increased by temperature rise is arranged at a position on a side of the exhausting fan opposed to the light source lamp and remote from the light source lamp and therefore, it is difficult to directly restrain temperature rise of the light source lamp by the opening portion. Therefore, when the exhausting fan is stopped by stopping to operate the projector in the structure disclosed in JP-A-9-304834, mentioned above, similar to the projector 100 of the other example of the background art shown in FIG. 11, there is brought about a drawback that rapid temperature rise is brought about at the outer peripheral face of the light source lamp immediately after stopping the exhausting fan by stopping to operate the projector. Therefore, also in JP-A-9-304834, mentioned above, similar to the projector 100 according to the other example of the background art shown in FIG. 11, there poses a problem that thermal deterioration, deformation or the like of the part is brought about at the surrounding of the light source lamp owing to rapid temperature rise of the outer peripheral face of the light source lamp.

SUMMARY OF THE INVENTION

The invention has been carried out in order to resolve the above-described problem and it is an object of the invention to provide a projector capable of lowering temperature of an outer peripheral face of a light source lamp rising rapidly immediately after stopping to operate the projector swiftly to predetermined temperature.

In order to achieve the above-described object, according to a first aspect of the invention, there is provided a projector which is a projector including a light source lamp including a light source, a reflector in a recessed shape provided to cover the light source for reflecting light from the light source, and a flange portion provided at an end portion of the reflector, a lamp case attached with the light source lamp, and a cooling fan for maintaining a temperature of the light source lamp at a predetermined temperature, the projector further including a heat radiating member for cooling an outer peripheral face of the light source lamp, wherein the heat radiating member including a flange attaching portion in a ring-like shape attached to the flange portion of the light source lamp, a plurality of fixing portions connected with the flange attaching portion in the ring-like shape and projected from the flange attaching portion in the ring-like shape to a side of the lamp case for attaching the light source lamp to the lamp case, and a plurality of heat radiating fin portions connected with the flange attaching portion in the ring-like shape and projected from the flange attaching portion in the ring-like shape to a side of the outer peripheral face of the light source lamp, the heat radiating fin portion is formed by a shape memory alloy brought into close contact with the outer peripheral face of the light source lamp when a temperature at a vicinity of the outer peripheral face of the light source lamp becomes higher than the predetermined temperature and separated from the outer peripheral face of the light source lamp when the temperature at the vicinity of the outer peripheral face of the light source lamp becomes lower than the predetermined temperature, and the heat radiating fin portion includes a fin portion arranged to guide a wind blown from the cooling fan to the side of the outer peripheral face of the light source lamp, and an opening portion for escaping the wind blown from the cooling fan guided by the fin portion to the side of the outer peripheral face of the light source lamp.

In the projector according to the first aspect of the invention, as described above, by providing the heat radiating member for cooling the outer peripheral face of the light source lamp and constituting the heat radiating member to include the heat radiating fin portion formed by the shape memory alloy brought into close contact with the outer peripheral face of the light source lamp when the temperature at the vicinity of the outer peripheral face of the light source lamp becomes higher than the predetermined temperature and separated from the outer peripheral face of the light source lamp when the temperature at the vicinity of the outer peripheral face of the light source lamp becomes lower than the predetermined temperature, when the temperature at the outer peripheral face of the light source lamp rapidly rises by residual heat of the light source of the light source lamp immediately after stopping the cooling fan by stopping to operate the projector, the heat radiating fin portion is brought into close contact with the outer peripheral face of the light source lamp and therefore, the temperature of the outer peripheral face of the light source lamp can be lowered to the predetermined temperature swiftly by the radiating fin portion. Thereby, there can be restrained deterioration and deformation by heat of a part at a surrounding of the light source lamp caused by rapid temperature rise of the outer peripheral face of the light source lamp immediately after stopping the cooling fan. As a result, it is not necessary to form a part and a cabinet made of a resin arranged at the surrounding of the light source lamp by an expensive heat resistant material and therefore, product cost can be reduced. Further, during a time period of moving the cooling fan in operating the projector, when the heat radiating fin portion is separated from the outer peripheral face of the light source lamp, the temperature at the outer peripheral face of the light source lamp can be maintained (controlled) at the predetermined temperature by the cooling fan.

Further, according to the first aspect, by constituting the heat radiating member to integrally include the fixing portion for fixing the light source lamp to the lamp case, in comparison with the case of separately providing the heat radiating member and the fixing member, an increase in a number of parts can be restrained.

Further, according to the first aspect, by constituting the heat radiating fin portion by the fin portion arranged to guide the wind blown from the cooling fan to the side of the outer peripheral face of the light source lamp and the opening portion for escaping the wind blown from the cooling fan guided by the fin portion to the side of the outer peripheral face of the light source lamp, during a time period of moving the cooling fan by operating the projector, the wind blown by the cooling fan can easily be guided to the outer peripheral face of the light source lamp. Thereby, cooling (temperature control) of the outer peripheral face of the light source lamp in operating the projector can further efficiently be carried out.

According to a second aspect of the invention, there is provided a projector including a light source lamp including a light source and a reflector provided to cover the light source for reflecting light from the light source, a lamp case attached with the light source lamp, a cooling fan for maintaining a temperature of the light source lamp at a predetermined temperature, and a heat radiating member for cooling an outer peripheral face of the light source lamp, wherein the heat radiating member includes a heat radiating portion formed by a shape memory alloy brought into close contact with the outer peripheral face of the light source lamp when a temperature at a vicinity of the outer peripheral face of the light source lamp becomes higher than the predetermined temperature and separated from the outer peripheral face of the light source lamp when the temperature at the vicinity of the outer peripheral face of the light source lamp becomes lower than the predetermined temperature.

In the projector according to the second aspect of the invention, as described above, by providing the heat radiating member for cooling the outer peripheral face of the light source lamp and constituting the heat radiating member to include the heat radiating portion formed by the shape memory alloy brought into close contact with the outer peripheral face of the light source lamp when the temperature at the vicinity of the outer peripheral face of the light source lamp becomes higher than the predetermined temperature and separated from the outer peripheral face of the light source lamp when the temperature at the vicinity of the outer peripheral face of the light source lamp becomes lower than the predetermined temperature, when the temperature of the outer peripheral face of the light source lamp rapidly rises by residual heat of the light source of the light source lamp immediately after stopping the cooling fan by stopping to operate the projector, the heat radiating portion is brought into close contact with the outer peripheral face of the light source lamp and therefore, the temperature of the outer peripheral face of the light source lamp can be lowered to the predetermined temperature swiftly by the heat radiating portion. Thereby, there can be restrained deterioration and deformation by heat of the part at the surrounding of the light source lamp caused by rapid temperature rise of the outer peripheral face of the light source lamp immediately after stopping the cooling fan. As a result, it is not necessary to form the part and the cabinet made of a resin arranged at the surrounding of the light source lamp by an expensive heat resistant material and therefore, product cost can be reduced. Further, during a time period of moving the cooling fan in operating the projector, when the heat radiating portion is separated from the outer peripheral face of the light source lamp, the temperature of the outer peripheral face of the light source lamp can be maintained (controlled) at the predetermined temperature by the cooling fan.

In the projector according to the second aspect, preferably, the heat radiating member includes an attaching portion attached to the light source lamp and a fixing portion connected with the attaching portion for attaching the light source lamp to the lamp case in addition to the heat radiating portion. When constituted in this way, in comparison with a case of separately providing the heat radiating member and the fixing member, an increase in a number of parts can be restrained.

In the projector according to the second aspect, preferably, the heat radiating portion includes a fin portion arranged to guide a wind blown from the cooling fan to a side of the outer peripheral face of the light source lamp. When constituted in this way, during the time period of moving the cooling fan by operating the projector, the wind blown by the cooling fan can be guided to the side of the outer peripheral face of the light source lamp and therefore, cooling (temperature control) of the outer peripheral face of the light source lamp in operating the projector can further efficiently be carried out.

In this case, preferably, the heat radiating portion includes an opening portion for escaping the wind blown from the cooling fan guided by the fin portion to the side of the outer peripheral face of the light source lamp. When constituted in this way, the wind blown by the cooling fan can directly be blown easily to the outer peripheral face of the light source lamp.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

An explanation will be given of an embodiment of the invention in reference to the drawings as follows.

Figure 1:
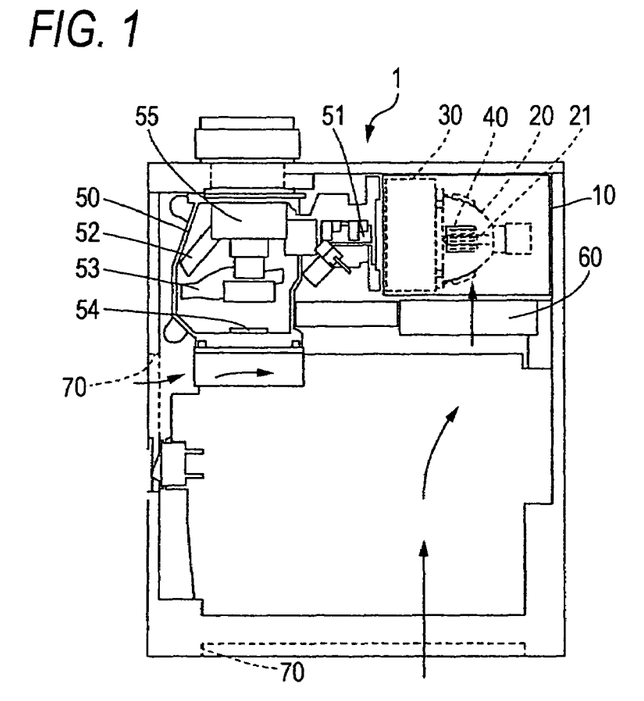
FIG. 1 is a top view of a projector having a cooling fan for maintaining alight source lamp at predetermined temperature according to an embodiment of the invention.
Figure 2:
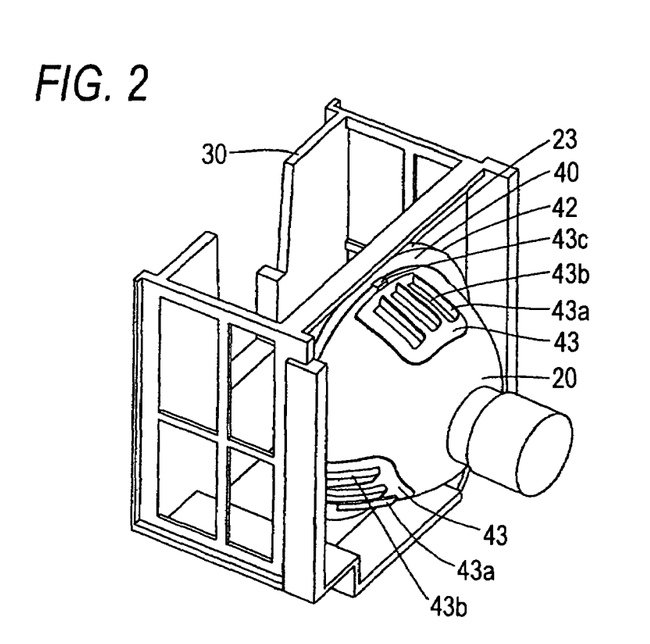
FIG. 2 is a perspective view showing the light source lamp, a lamp case and a heat radiating member of the projector according to the embodiment of the invention.
Figure 3:
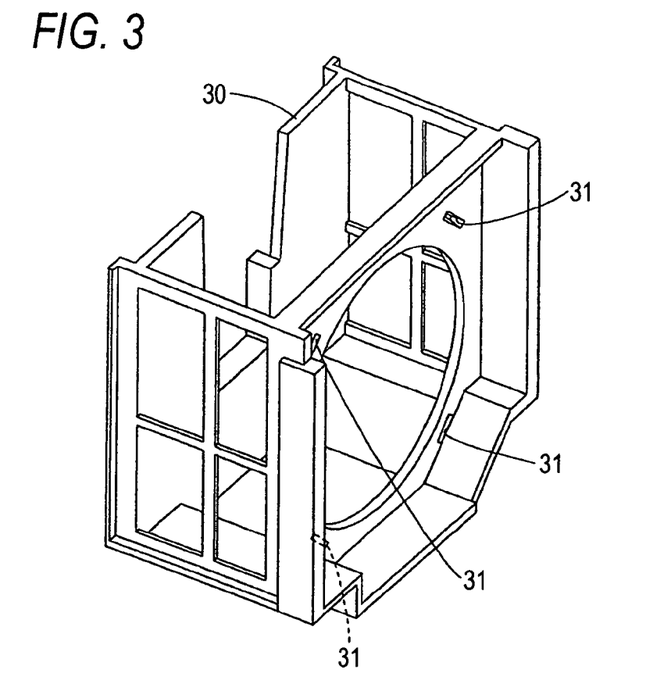
FIG. 3 is a perspective view showing the lamp case of the projector according to the embodiment of the invention shown in FIG. 1.
Figure 4:
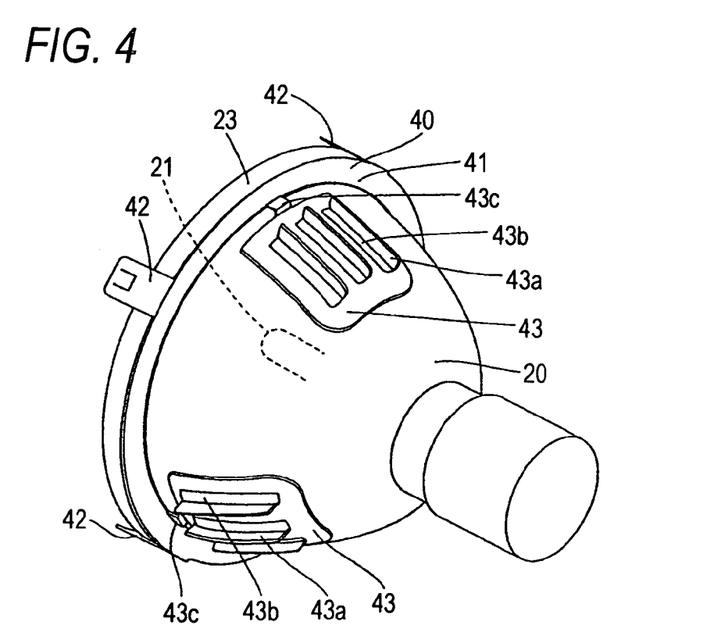
FIG. 4 is a perspective view showing the light source lamp and the heat radiating member of the projector according to the embodiment of the invention shown in FIG. 1.
Figure 5:
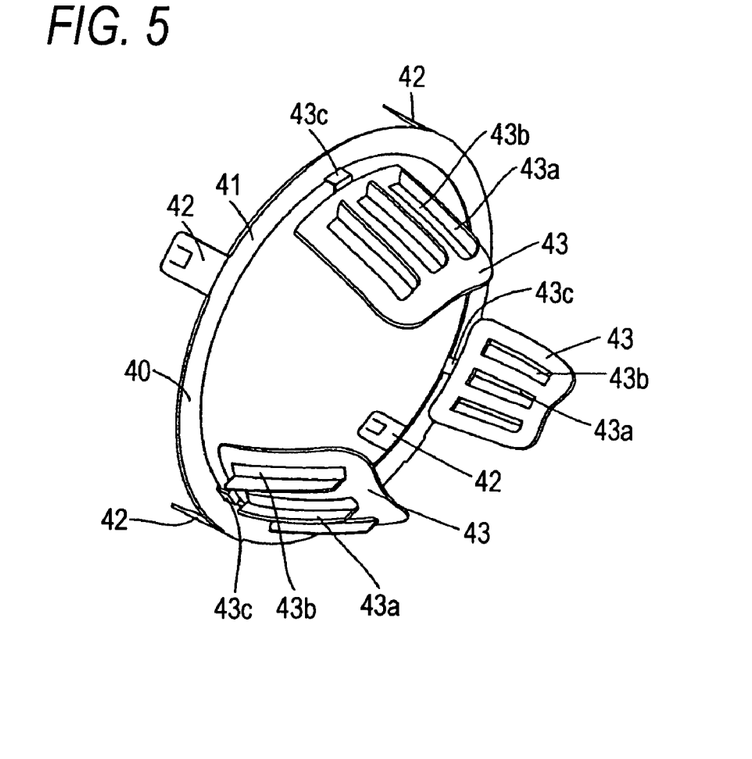
FIG. 5 is a perspective view showing the heat radiating member attached to the light source lamp shown in FIG. 4.
Figure 6:
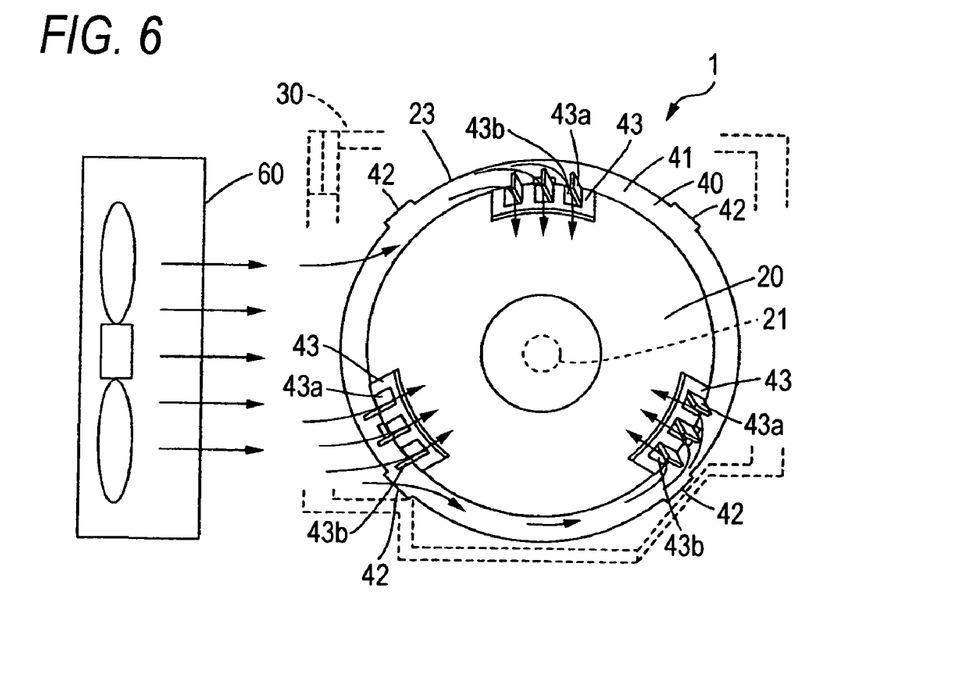
FIG. 6 is a view showing a state of the heat radiating member and the cooling fan in operating the projector according to the embodiment of the invention shown in FIG. 1.
Figure 7:
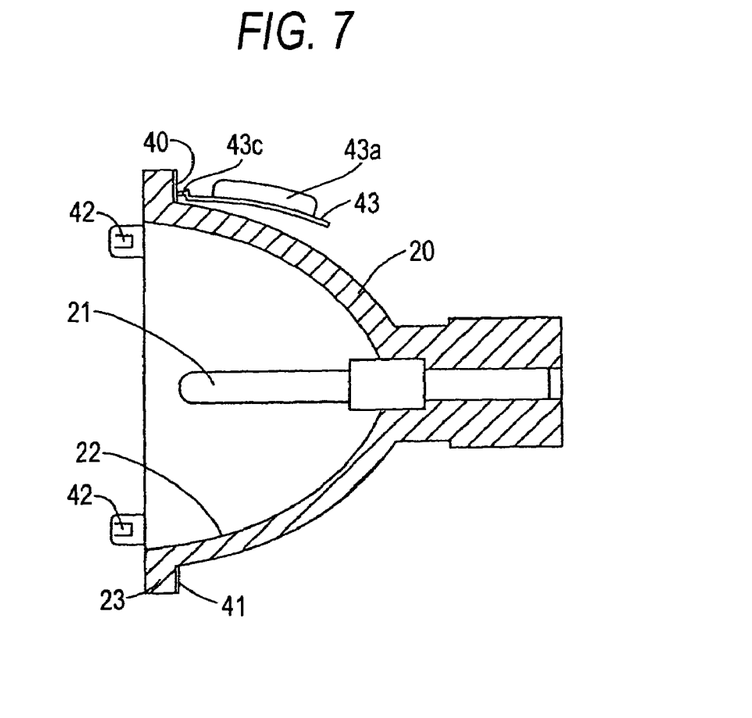
FIG. 7 is a sectional view showing a state of the heat radiating member in operating the projector.
Figure 8:
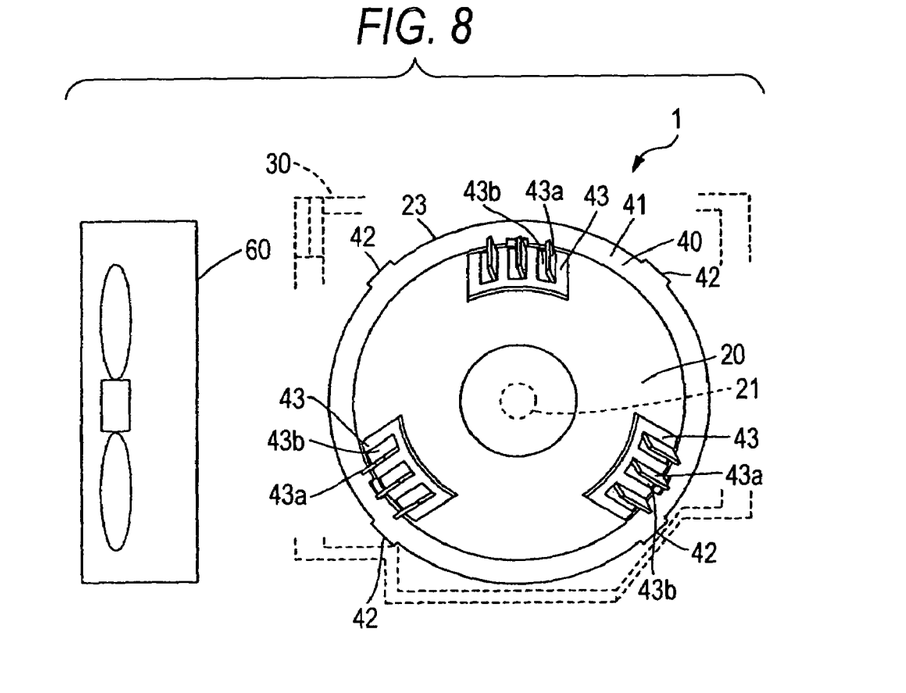
FIG. 8 is a view showing a state of the heat radiating member and the cooling fan immediately after stopping to operate the projector according to the embodiment of the invention shown in FIG. 1.
Figure 9:
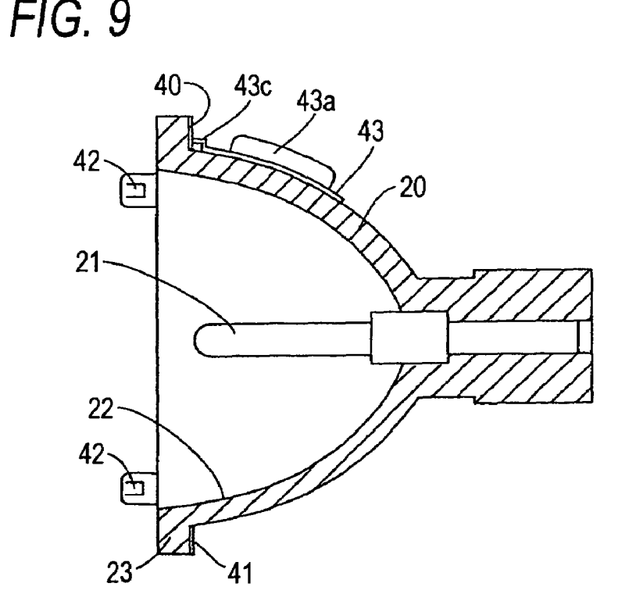
FIG. 9 is a sectional view showing a state of the heat radiating member immediately after stopping to operate the projector.

FIG. 1 is a top view of a projector having a cooling fan for maintaining a light source lamp according to an embodiment of the invention at predetermined temperature. FIG. 2 is a perspective view showing a light source lamp, a lamp case and a heat radiating member of the projector according to the embodiment of the invention. FIG. 3 is a perspective view showing the lamp case of the projector according to the embodiment of the invention. FIG. 4 is a perspective view showing the light source lamp and the heating radiating member of the projector according to the embodiment of the invention shown in FIG. 1. FIG. 5 is a perspective view showing the heat radiating member attached to the light source lamp shown in FIG. 4. FIG. 6 is a view showing a state of the heat radiating member and a cooling fan in operating the projector according to the embodiment of the invention shown in FIG. 1. FIG. 7 is a sectional view showing a state of the heat radiating member in operating the projector. FIG. 8 is a view showing a state of the heat radiating member and the cooling fan immediately after stopping to operate the projector according to the embodiment of the invention shown in FIG. 1. FIG. 9 is a sectional view showing a state of the heat radiating member immediately after stopping to operate the projector. First a structure of a projector 1 according to the embodiment will be explained in reference to FIG. 1 through FIG. 9.

As shown by FIG. 1, the projector 1 according to the embodiment is provided with a lamp case holder 10 including a heat resistant resin including glass fiber, a light source lamp 20 including an ultra high pressure mercury lamp contained at inside of the lamp case holder 10, a lamp case 30 including a heat resistant resin including glass fiber attached with the light source lamp 20, a heat radiating member 40 attached to the light source lamp 20 for cooling an outer peripheral face of the light source lamp 20, a projecting portion 50 for forming an image for projecting to a screen by using light of the light source lamp 20, a cooling fan 60 arranged on a side of a side face of the light source lamp 20 for maintaining the light source lamp 20 at predetermined temperature, and a suction port 70 for supplying outside air to the cooling fan 60 at inside of the apparatus.

As shown by FIG. 2, the light source lamp 20 is attached to the lamp case 30. As shown by FIG. 7, the light source lamp 20 including the ultra high pressure mercury lamp includes a light source 21, a reflector 22, and a flange portion 23 provided at an end portion of the reflector 22 in a recessed shape for reflecting light from the light source 21 in a front direction. The light source 21 is provided at a center portion of the reflector 22.

Further, as shown by FIG. 3, the lamp case 30 includes four of fixed portion engaging portions 31. The fixed portion engaging portion 31 is used in attaching the light source lamp 20 to the lamp case 30.

Here, according to the embodiment, as shown by FIG. 5, the heat radiating member 40 attached to the light source lamp 20 is formed by a plate member made of a shape memory alloy. The heat radiating member 40 includes a flange attaching portion 41 in a ring-like shape, a fixing portion 42 and a heat radiating fin portion 43. As shown by FIG. 4, the flange attaching portion 41 in the ring-like shape is fitted to the flange portion 23 of the light source lamp 20. Further, the fixing portion 42 is formed integrally with the flange attaching portion 41 in the ring-like shape and is formed to project from the flange attaching portion 41 in the ring-like shape to a side of the lamp case 30. As shown by FIG. 5, four of the fixing portions 32 are provided to the flange attaching portion 41 in the ring-like shape at equal intervals of 90 degrees. As shown by FIG. 3 through FIG. 5, the four fixing portions 42 are fitted to the four fixed portion engaging portions 31 of the lamp case 30 in attaching the light source lamp 20 to the lamp case 30. Further, the heat radiating fin portion 43 is formed integrally with the flange attaching portion 41 in the ring-like shape and is formed to project from the flange attaching portion 41 in the ring-like shape to a side of an outer peripheral face of the light source lamp 20. As shown by FIG. 5, three of the heat radiating fin portions 43 are provided to the flange attaching portion 41 in the ring-like shape at equally intervals of 120 degrees. As shown by FIG. 4, the heat radiating fin portion 43 is formed in a shape of a curved face to cover the outer peripheral face of the light source lamp 20.

Further, the heat radiating fin portion 43 includes a fin portion 43a, an opening portion 43b, and a base end portion 43c for integrally connecting the heating radiating fin portion 43 and the flange attaching portion 41 in the ring-like shape. The fin portion 43a and the opening-portion 43b are formed by cutting off a portion of the heat radiating fin portion 43 formed in the shape of the curved face in a channel-like shape and folding to bend a cut off portion in a direction of being remote from the outer peripheral face of the light source lamp 20.

Further, as shown by FIG. 6, the fin portion 43a is formed to be opposed to the cooling fan 60 and inclined to a side of the cooling fan 60 by a predetermined angle from an angle orthogonal to a face formed with the opening portion 43b to be able to receive wind blown from the cooling fan 60 provided on the side of the side face of the light source lamp 20 to guide to the side of the outer peripheral face of the light source lamp 20. Further, the opening portion 43b is provided on a side of the cooling fan 60 of each of the fin portions 43a to be able to efficiently escape wind blown from the cooling fan 60 a direction of which is changed by the fin portion 43a to the outer peripheral face of the light source lamp 20.

Here, according to the embodiment, as shown by FIG. 7 and FIG. 9, a shape of the base end portion 43c of the heat radiating fin portion 43 formed by the shape memory alloy is formed to differ between a case in which temperature is lower than predetermined temperature and a case in which the temperature is higher than the predetermined temperature. That is, when temperature at a vicinity of the outer peripheral face of the light source lamp 20 is maintained at predetermined temperature (about 400 .C through about 500 .C) by the cooling fan 60 and a temperature sensor (not illustrated) by operating the projector 1, as shown by FIG. 6 and FIG. 7, the base end portion 43c of the heat radiating fin portion 43 is bent such that the heat radiating fin portion 43 is separated from the outer peripheral face of the light source lamp 20. Further, when the temperature at the vicinity of the outer peripheral face of the light source lamp 20 rapidly rises from the predetermined temperature (about 400. C through about 500. C) to about 500. C through about 600. C by residual heat of the light source 21 of the light source lamp 20 immediately after stopping the cooling fan by stopping to operate the projector 1, as shown by FIG. 8, and FIG. 9, the base end portion 43c of the heat radiating fin portion is bent such that the heat radiating fin portion 43 is brought into close contact with the outer peripheral face of the light source lamp 20.

Further, in the projector 1 according to the embodiment, as shown by FIG. 1, the projecting portion 50 includes a light tunnel 51, a mirror 52, a lens 53, a DMD element 54, and a projecting lens 55. The light tunnel 51 is provided with a function of shaping light from the light source lamp 20 in a rectangular shape. Further, the mirror 52 is provided for reflecting light in the rectangular shape shaped by the light tunnel 51 in a direction of arranging the DMD element 54. Light reflected by the mirror 52 is made to be incident on the DMD element 54 via the lens 53. Further, the DMD element 54 is an element for forming an image by controlling light incident on the DMD element 54. Further, the image formed by the DMD element 54 is projected to a screen (not illustrated) by passing the projecting lens 55.

According to the embodiment, as described above, by providing the heat radiating member 40 for cooling the outer peripheral face of the light source lamp 20 and constituting the heat radiating member 40 to include the heat radiating fin portion 42 formed by the shaped memory alloy brought into close contact with the outer peripheral face of the light source lamp 20 when the temperature at the vicinity of the outer peripheral face of the light source lamp 20 becomes higher than the predetermined temperature and separated from the outer peripheral face of the light source lamp 20 when the temperature at the vicinity of the outer peripheral face of the light source lamp 20 becomes lower than the predetermined temperature, when the temperature of the outer peripheral face of the light source lamp 20 rapidly rises by the residual heat of the light source of the light source lamp 20 immediately after stopping the cooling fan 60 by stopping to operate the projector 1, the heat radiating fin portion 43 is brought into close contact with the outer peripheral face of the light source lamp 20 and therefore, the temperature of the outer peripheral face of the light source lamp 20 can swiftly be lowered to the predetermined temperature by the heat radiating fin portion 43. Thereby, there can be restrained deterioration and deformation by heat of the part at the surrounding of the light source lamp 20 caused by rapid temperature rise of the outer peripheral face of the light source lamp 20 immediately after stopping the cooling fan 60. As a result, it is not necessary to form the part and the cabinet made of a resin arrange at the surrounding of the light source lamp 20 by an expensive heat radiating material and therefore, the product cost can be reduced.

Further, according to the embodiment, during a time period of moving the cooling fan 60 in operating the projector 1, by separating the heat radiating fin portion 43 from the outer peripheral face of the light source lamp 20, the temperature of the outer peripheral face of the light source lamp 20 can be maintained (controlled) at the predetermined temperature by the cooling fan 60.

Further, according to the embodiment, by constituting the heat radiating member 40 to integrally include the fixing portion 42 for fixing the heat radiating member 40 to the lamp case 30, in comparison with the case of separately providing the heat radiating member and the fixing member, an increase in a number of parts can be restrained.

Further, according to the embodiment, by constituting the heat radiating fin portion 43 to include the fin portion 43a arranged to guide wind blown from the cooling fan 60 to the side of the outer peripheral face of the light source lamp 20, and the opening portion 43b for escaping wind blown from the cooling fan 60 guided by the fin portion 43a to the side of the outer peripheral face of the light source lamp 20, during a time period of moving the cooling fan 60 by operating the projector 1, the wind blown from the cooling fan 60 can easily be guided to the outer peripheral face of the light source lamp 20. Thereby, cooling (temperature control) of the outer peripheral face of the light source lamp 20 in operating the projector 1 can further efficiently be carried out.

Further, the embodiment disclosed at this time is to be regarded as an exemplification in all the aspects and not to be restrictive. The range of the invention is indicated not by the above-described explanation of the embodiment but by the scope of claims and includes all the modifications in the significance of equivalency of the scope of claims and within the range.

For example, although according to the above-described embodiment, the heat radiating member 40 is constituted to attach the heat radiating member 40 to the light source lamp 20 by the flange attaching portion 41 in the ring-like shape integrally formed with the heat radiating member 40, the invention is not limited thereto but the flange attaching portion 41 in the ring-like shape may be formed by other shape. Further, the heat radiating member may not be attached to the light source lamp but may be attached to other member.

Figure 14:
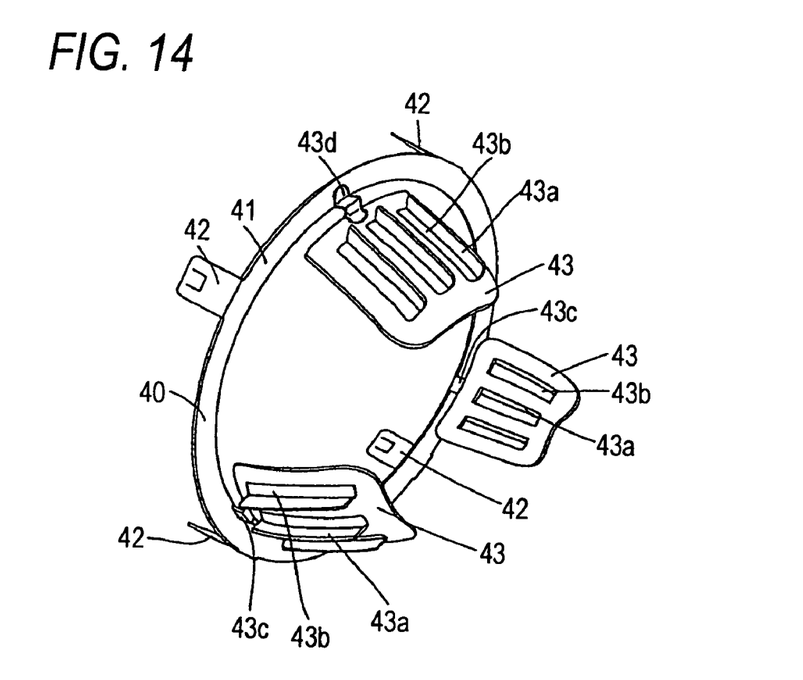
FIG. 14 is a perspective view showing an example of a heat radiating member attached to the light source lamp.

Further, as shown in FIG. 14, a flange attaching portion 41 and a heat radiating fin portion 43 may be connected with a base end portion 43d which is formed by a shape memory alloy and is bent such that the heat radiating portion is brought into close contact with the outer peripheral face of the light source lamp when a temperature at a vicinity of the outer peripheral face of the light source lamp becomes higher than the predetermined temperature and separated from the outer peripheral face of the light source lamp when the temperature at the vicinity of the outer peripheral face of the light source lamp becomes lower than the predetermined temperature. Further, the heat radiating fin portion 43 may be formed using a material except a shape memory alloy.

Further, although according to the above-described embodiment, the heat radiating fin portion including the fin portion and the opening portion is used as the heat radiating portion of the heat radiating member 40, the invention is not limited thereto but the heat radiating portion of the heat radiating member may be a heating radiating portion which does not include the fin portion and the opening portion.

What is claimed is:

1. A projector comprising:
a light source lamp including a light source, a reflector in a recessed shape provided to cover the light source for reflecting light from the light source, and a flange portion provided at an end portion of the reflector;
a lamp case attached with the light source lamp;
a cooling fan for maintaining a temperature of the light source lamp at a predetermined temperature; and
a heat radiating member for cooling an outer peripheral face of the light source lamp, comprising:
a flange attaching portion in a ring-like shape attached to the flange portion of the light source lamp;
a plurality of fixing portions connected with the flange attaching portion in the ring-like shape and projected from the flange attaching portion in the ring-like shape to a side of the lamp case for attaching the light source lamp to the lamp case; and
a plurality of heat radiating fin portions connected with the flange attaching portion in the ring-like shape and projected from the flange attaching portion in the ring-like shape to a side of the outer peripheral face of the light source lamp;
wherein the heat radiating fin portion is formed of a shape memory alloy, is brought into close contact with the outer peripheral face of the light source lamp when a temperature at a vicinity of the outer peripheral face of the light source lamp becomes higher than the predetermined temperature, and is separated from the outer peripheral face of the light source lamp when the temperature at the vicinity of the outer peripheral face of the light source lamp becomes lower than the predetermined temperature; and
wherein the heat radiating fin portion includes a fin portion arranged to guide a wind blown from the cooling fan to the side of the outer peripheral face of the light source lamp, and an opening portion for escaping the wind blown from the cooling fan guided by the fin portion to the side of the outer peripheral face of the light source lamp.

2. A projector comprising:
a light source lamp including a light source and a reflector provided to cover the light source for reflecting light from the light source;
a lamp case attached with the light source lamp;
a cooling fan for maintaining a temperature of the light source lamp at a predetermined temperature; and
a heat radiating member for cooling an outer peripheral face of the light source lamp, comprising a heat radiating portion formed of a shape memory alloy,
wherein the heat radiating portion is brought into close contact with the outer peripheral face of the light source lamp when a temperature at a vicinity of the outer peripheral face of the light source lamp becomes higher than the predetermined temperature, and
wherein the heat radiating portion is separated from the outer peripheral face of the light source lamp when the temperature at the vicinity of the outer peripheral face of the light source lamp becomes lower than the predetermined temperature.

3. The projector according to claim 2, wherein the heat radiating member includes an attaching portion attached to the light source lamp and a fixing portion connected with the attaching portion for attaching the light source lamp to the lamp case in addition to the heat radiating portion.

4. The projector according to claim 2, wherein the heat radiating portion includes a fin portion arranged to guide a wind blown from the cooling fan to a side of the outer peripheral face of the light source lamp.

5. The projector according to claim 4, wherein the heat radiating portion includes an opening portion for allowing escape of the wind blown from the cooling fan guided by the fin portion to the side of the outer peripheral face of the light source lamp.

6. A projector comprising:
   a light source lamp including a light source and a reflector provided to cover the light source for reflecting light from the light source;
   a lamp case attached with the light source lamp;
   a cooling fan for maintaining a temperature of the light source lamp at a predetermined temperature; and
   a heat radiating member for cooling an outer peripheral face of the light source lamp, comprising:
      a heat radiating portion; and
      a base end portion formed by a shape memory alloy bent such that the heat radiating portion is brought into close contact with the outer peripheral face of the light source lamp when a temperature at a vicinity of the outer peripheral face of the light source lamp becomes higher than the predetermined temperature and is separated from the outer peripheral face of the light source lamp when the temperature at the vicinity of the outer peripheral face of the light source lamp becomes lower than the predetermined temperature.

7. The projector of claim 6, wherein the heat radiating member further comprises:
   a ring-shaped flange attaching portion connected to the base end portion; and
   a plurality of fixing portions to attach the light source lamp to the lamp case,
   wherein the base end portion connects the ring-shaped flange attaching portion to the heat radiating portion.

8. The projector of claim 6, wherein the heat radiating portion comprises:
   at least one fin portion opposing the cooling fan and directing air from the cooling fan toward the light source lamp; and
   at least one opening portion receiving air directed by the at least one fin portion.

9. The projector of claim 6, wherein the heat radiating portion conforms to a shape of the light source lamp.

* * * * *